United States Patent
Gao et al.

(10) Patent No.: US 10,014,364 B1
(45) Date of Patent: Jul. 3, 2018

(54) ON-CHIP RESISTORS WITH A TUNABLE TEMPERATURE COEFFICIENT OF RESISTANCE

(71) Applicant: GLOBALFOUNDRIES Inc., Grand Cayman (KY)

(72) Inventors: Qun Gao, Clifton Park, NY (US); Anthony Chou, Beacon, NY (US); Stephen Furkay, Burlington, VT (US); Naved Siddiqui, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/460,914

(22) Filed: Mar. 16, 2017

(51) Int. Cl.
*H01L 49/02* (2006.01)
*H01L 21/3213* (2006.01)
*H01L 27/06* (2006.01)
*H01L 35/14* (2006.01)
*H01L 35/32* (2006.01)

(52) U.S. Cl.
CPC ........ *H01L 28/24* (2013.01); *H01L 21/32133* (2013.01); *H01L 27/0676* (2013.01); *H01L 35/14* (2013.01); *H01L 35/32* (2013.01)

(58) Field of Classification Search
CPC .............. H01L 28/24; H01L 21/32133; H01L 27/0676
See application file for complete search history.

(56) References Cited

U.S. PATENT DOCUMENTS

| | | | |
|---|---|---|---|
| 4,104,607 A | 8/1978 | Jones | |
| 5,507,879 A | 4/1996 | Gyoten et al. | |
| 6,890,810 B2 | 5/2005 | Amadon et al. | |
| 7,495,467 B2 | 2/2009 | Lin et al. | |
| 2004/0227522 A1* | 11/2004 | Male | G01R 31/025 324/524 |
| 2010/0270620 A1* | 10/2010 | Dibra | G01K 1/08 257/368 |
| 2012/0319241 A1* | 12/2012 | Lin | H01L 23/5228 257/538 |
| 2013/0334662 A1* | 12/2013 | Jackson | G01R 19/0092 257/536 |

* cited by examiner

*Primary Examiner* — Errol Fernandes
(74) *Attorney, Agent, or Firm* — Thompson Hine LLP; Yuanmin Cai (57) ABSTRACT

Device structures and fabrication methods for an on-chip resistor. A first Seebeck terminal is arranged to overlap with first and second resistor bodies of the on-chip resistor. A second Seebeck terminal is also arranged to overlap with the first and second resistor bodies. The second Seebeck terminal has a spaced relationship with the first Seebeck terminal along a length of the first and second resistor bodies. The temperature coefficient of resistance of the on-chip resistor is based at least in part on a Seebeck coefficient of first and second Seebeck terminals.

20 Claims, 6 Drawing Sheets

ON-CHIP RESISTORS WITH A TUNABLE TEMPERATURE COEFFICIENT OF RESISTANCE

BACKGROUND

The invention relates generally to semiconductor device and integrated circuit fabrication and, in particular, to device structures and fabrication methods for an on-chip resistor.

On-chip resistors are passive devices found in many integrated circuits. An on-chip resistor may be formed by depositing a layer of resistor material having a given thickness and patterning the resistor material layer to provide a resistor body that is dimensioned to a particular length and width. The resistance of an on-chip resistor is based on a combination of physical properties (i.e., cross-sectional area and length) and material properties (e.g., resistivity). An on-chip resistor may be coupled with an external load resistor of fixed resistance.

During operation, the temperature of an on-chip resistor changes due to Joule heating. The resistivity of the resistor material may vary widely as a function of temperature. The variation of the resistivity is governed by the temperature coefficient of resistance (TCR) of the resistor material. The TCR of the resistor material may be adjusted or tuned at the time of design and fabrication through an adjustment in material properties, such as resistor thickness, the doping level in the resistor material, the grain size of polycrystalline resistor material, and/or the composition of the resistor material.

Improved device structures and fabrication methods for an on-chip resistor are needed.

SUMMARY

In an embodiment of the invention, an on-chip resistor includes a first resistor body, a second resistor body, a first Seebeck terminal arranged to overlap with the first resistor body and the second resistor body, and a second Seebeck terminal arranged to overlap with the first resistor body and the second resistor body. The second Seebeck terminal has a spaced relationship with the first Seebeck terminal along a length of the first resistor body and the second resistor body. The temperature coefficient of resistance of the on-chip resistor is based at least in part on a Seebeck coefficient of first and second Seebeck terminals.

In an embodiment of the invention, a method includes forming a first resistor body and a second resistor body of an on-chip resistor, forming a first Seebeck terminal arranged to overlap with the first resistor body and the second resistor body, and forming a second Seebeck terminal arranged to overlap with the first resistor body and the second resistor body. The second Seebeck terminal has a spaced relationship with the first Seebeck terminal along a length of the first resistor body and the second resistor body. The temperature coefficient of resistance of the on-chip resistor is based at least in part on a Seebeck coefficient of first and second Seebeck terminals.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
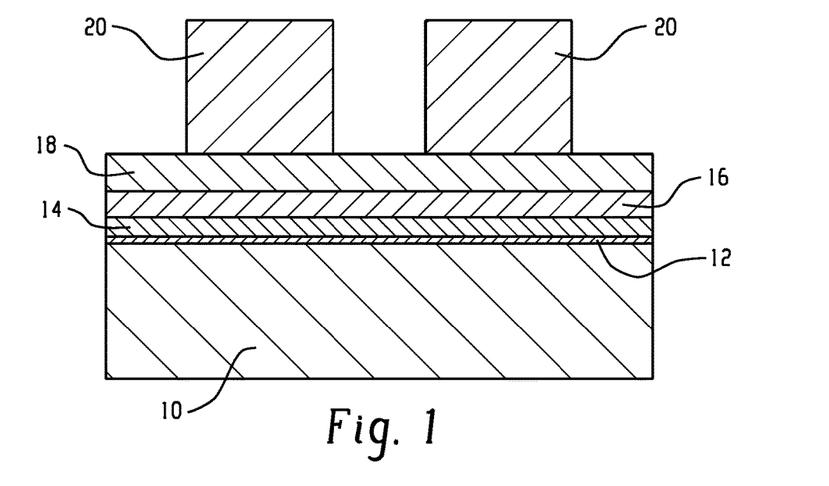
FIG. 1 is a cross-sectional view of a device structure at an initial fabrication stage of a processing method in accordance with embodiments of the invention.

With reference to FIG. 1 and in accordance with embodiments of the invention, a substrate 10 comprises a single-crystal semiconductor material usable to form the devices of an integrated circuit. For example, the substrate 10 may be a bulk wafer comprised of a monocrystalline silicon-containing material, such as single-crystal silicon, or a device layer of a silicon-on-insulator wafer. Pad layers 12, 14 are stacked on a top surface of the substrate 10. Pad layer 12 may be comprised of a dielectric material, such as silicon carbonitride (SiCN) deposited by chemical vapor deposition (CVD). Pad layer 14 is formed on the pad layer 12, and may be comprised of a dielectric material, such as silicon dioxide ($SiO_2$) deposited by CVD.

A layer 16 comprised of a resistor material is deposited on the top surface of the pad layer 14. The resistor material layer 16 is isolated electrically from the substrate 10 by the pad layers 12, 14. The resistor material of resistor material layer 16 has a given resistivity and a given temperature coefficient of resistance (TCR). The resistor material of resistor material layer 16 may be characterized by either a positive TCR or a negative TCR.

In an embodiment, the resistor material may be a metal that is suitable to form the body of a resistor. In an embodiment, the resistor material layer 16 may be comprised of tungsten silicide ($WSi_x$) that is deposited by physical vapor deposition (PVD) with, for example, a sputtering process. The amount of silicon in the deposited tungsten silicide may be determined, at least in part, by the composition of a sputter target used in the PVD process. The TCR of tungsten silicide varies as a function of the amount of silicon in its composition. For example, tungsten silicide may have a negative TCR that varies with the silicon content in a range from −110 ppm/° C. to −400 ppm/° C.

An etch mask is formed on the top surface of the resistor material layer 16. The etch mask may include, for example, a bottom anti-reflective coating (BARC) layer 18 deposited by CVD and a photoresist layer 20 comprised of a photoresist material that is applied by a spin coating process, pre-baked, exposed to a radiation projected through a photomask, baked after exposure, and developed with a chemical developer to form features at the intended locations for resistor bodies to be subsequently formed from the resistor material layer 16.

Figure 2:
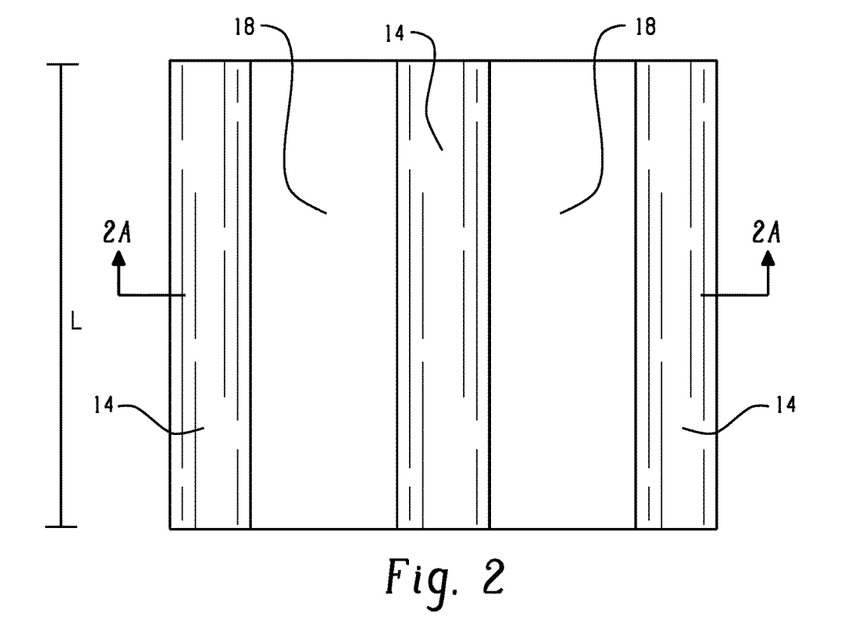
FIG. 2 is a top view of the device structure at a fabrication stage subsequent to FIG. 1.
Figure 2A:
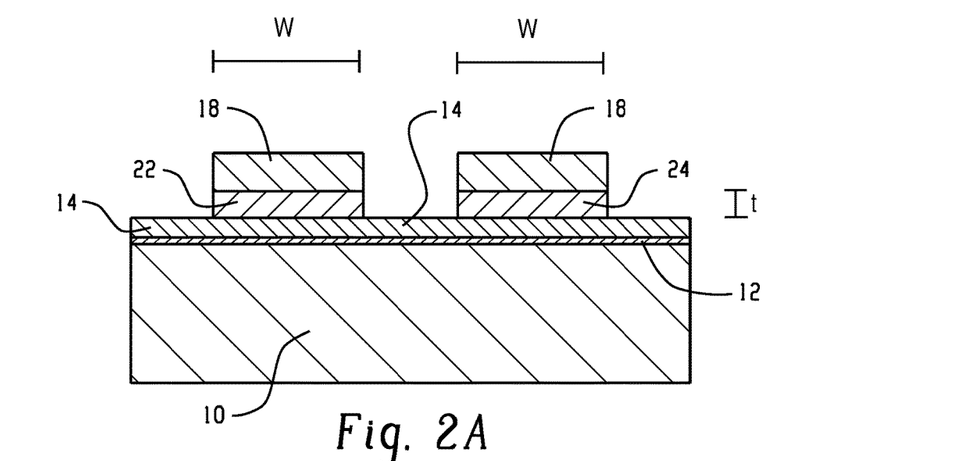
FIG. 2A is a cross-sectional view taken generally along line 2A-2A in FIG. 2.

With reference to FIGS. 2, 2A in which like reference numerals refer to like features in FIG. 1 and at a subsequent fabrication stage, the BARC layer 18 is patterned using the patterned photoresist layer 20, and the photoresist layer 20 is subsequently stripped. The resistor material layer 16 is then patterned using an etching process, such as reactive ion etching (RIE), that removes the material of resistor material layer 16 from areas not masked by the patterned BARC layer 18 and forms resistor bodies 22, 24 from the resistor material layer 16. The etching process may stop on the material of the pad layer 14.

The resistor bodies 22, 24 are isolated electrically from the substrate 10 and each other by the pad layers 12, 14. The resistor bodies 22, 24 are each comprised of material originating from the resistor material layer 16. In an embodiment, the resistor body 22 and the resistor body 24 may be rectangular in shape and may have a parallel, side-by-side arrangement, although other shapes and arrangements may be provided. The resistor body 22 and the resistor body 24 may have the thickness and composition of the resistor material layer 16. The resistor bodies 22, 24 each have a cross-sectional area given by the product of their width, W, and thickness, t, and have a length, L. In an embodiment, the resistor body 22 and the resistor body 24 may have the same cross-sectional area and the same length, as well as the same composition, such that the resistor bodies 22, 24 are characterized by identical electrical resistances. In an embodiment, the resistor body 22 and the resistor body 24 may have different cross-sectional areas and/or different lengths such that the resistor bodies 22, 24 are characterized by different electrical resistances. In an embodiment, the resistor bodies 22, 24 may be composed of materials with different TCRs.

Figure 3:
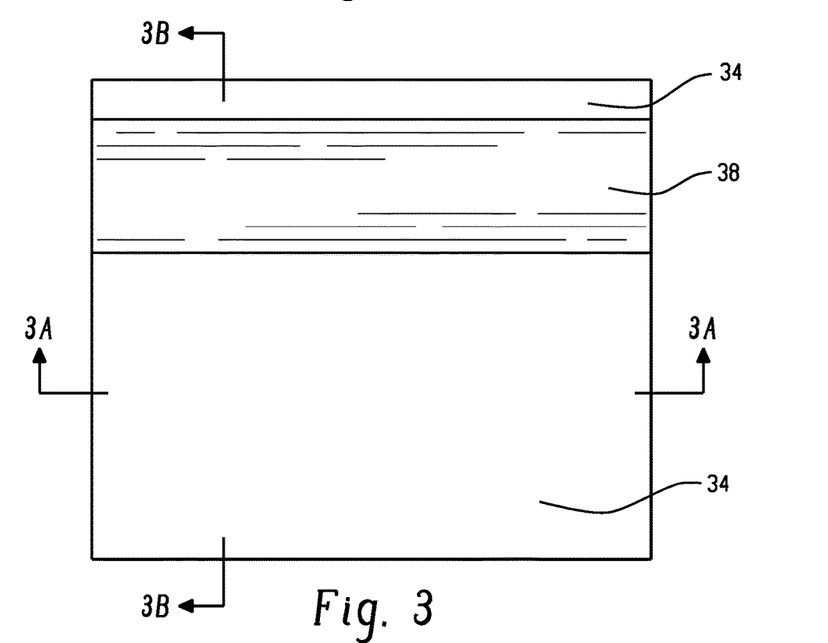
FIG. 3 is a top view of the device structure at a fabrication stage subsequent to FIG. 2.
Figure 3A:
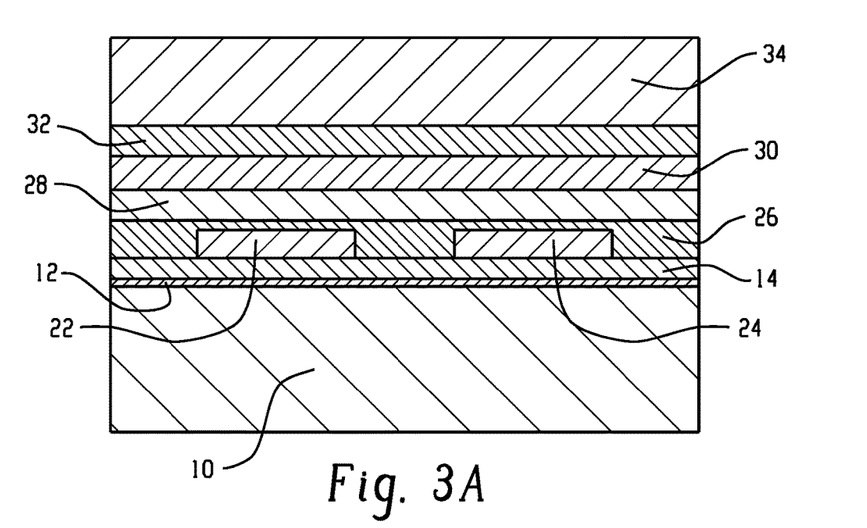
FIG. 3A is a cross-sectional view taken generally along line 3A-3A in FIG. 3.
Figure 3B:
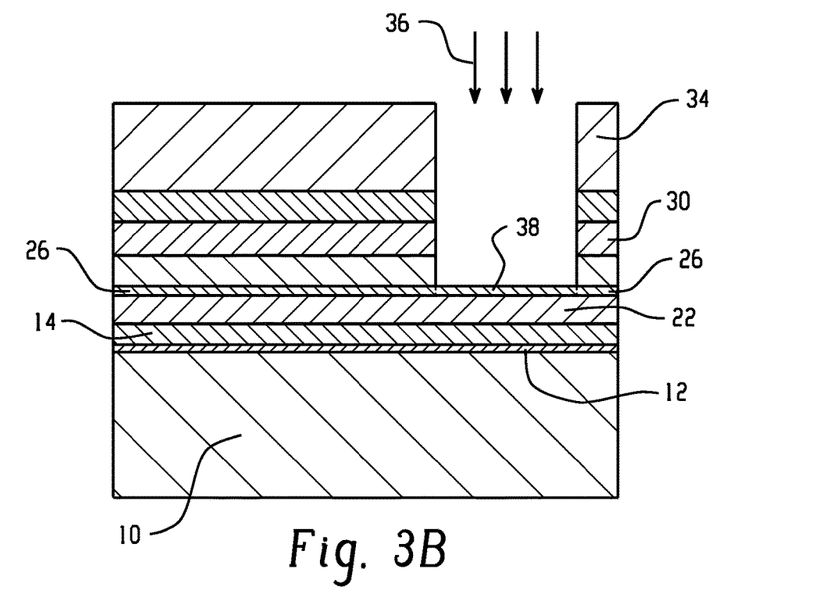
FIG. 3B is a cross-sectional view taken generally along line 3B-3B in FIG. 3.

With reference to FIGS. 3, 3A, 3B in which like reference numerals refer to like features in FIGS. 2, 2A and at a subsequent fabrication stage, the BARC layer 18 may be removed with an etching process, such as RIE, to reveal the resistor bodies 22, 24. A layer 26 comprised of a semiconductor material may be deposited by CVD on the resistor bodies 22, 24 and the pad layer 14, and planarized using, for example, chemical mechanical polishing (CMP) to remove topography. The layer 26 may be comprised a polycrystalline semiconductor material, such as a polycrystalline silicon (i.e., polysilicon). Sections of layer 26 fill the gap between the resistor body 22 and the resistor body 24, and the thickness of layer 26 is greater than the thickness of the resistor bodies 22, 24 such that the resistor bodies 22, 24 are located beneath respective overlying sections of the layer 26.

Hardmask layers 28, 30, a BARC layer 34, and a block mask 32 are formed on the top surface of the layer 26. The hardmask layer 28 may be comprised of a silicon-based spin-on silicon hardmask material (Si—SOH), and the hardmask layer 30 on top of the hardmask layer 28 may be comprised of silicon oxynitride (SiON) deposited by CVD. The block mask 32, which is applied on the top surface of the BARC layer 34, may be comprised of a photoresist material that is applied by a spin coating process, pre-baked, exposed to a radiation projected through a photomask, baked after exposure, and developed with a chemical developer to form an opening at an intended location for a Seebeck terminal 38 to be formed by ion implantation in the layer 26.

With the block mask 32 present, energetic ions, as indicated diagrammatically by the single-headed arrows 36, are introduced into the layer 26 across the area of the opening in the block mask 32 to form the Seebeck terminal 38. The opening in the block mask 32 and the Seebeck terminal 38 extend transverse to the resistor bodies 22, 24, and cross over each of the resistor bodies 22, 24 at a location along their respective lengths. In an embodiment, the ions 36 may deliver a p-type dopant (e.g., boron (B)) selected from Group III of the Periodic Table in a concentration effective to impart p-type conductivity to the semiconductor material of the layer 26. The ions 36 may be generated from a suitable source gas and implanted with selected implantation conditions (e.g., ion species, dose, kinetic energy) using an ion implantation tool. Areas of the layer 26 covered by the block mask 32 are not implanted.

Figure 4:
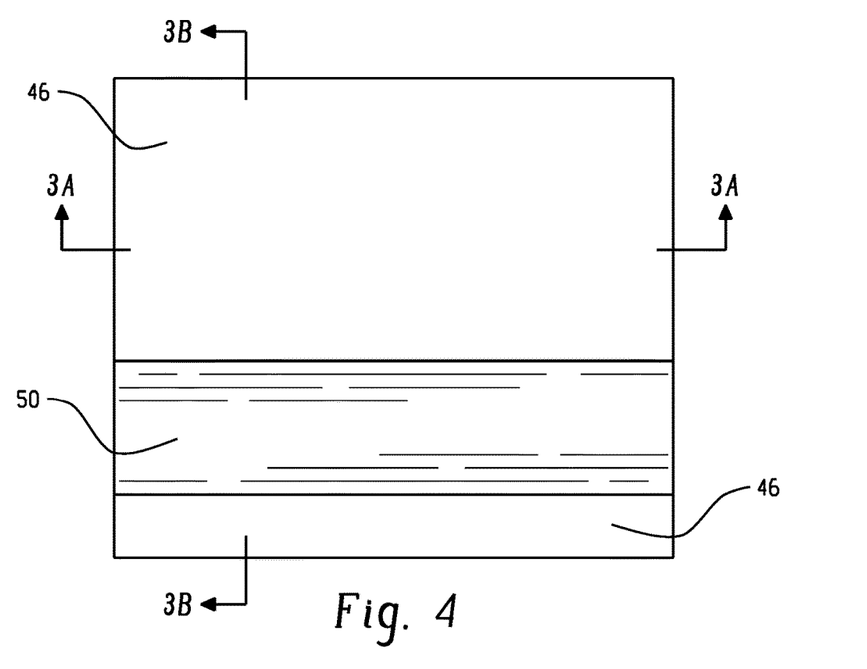
FIG. 4 is a top view of the device structure at a fabrication stage subsequent to FIG. 3.
Figure 4A:
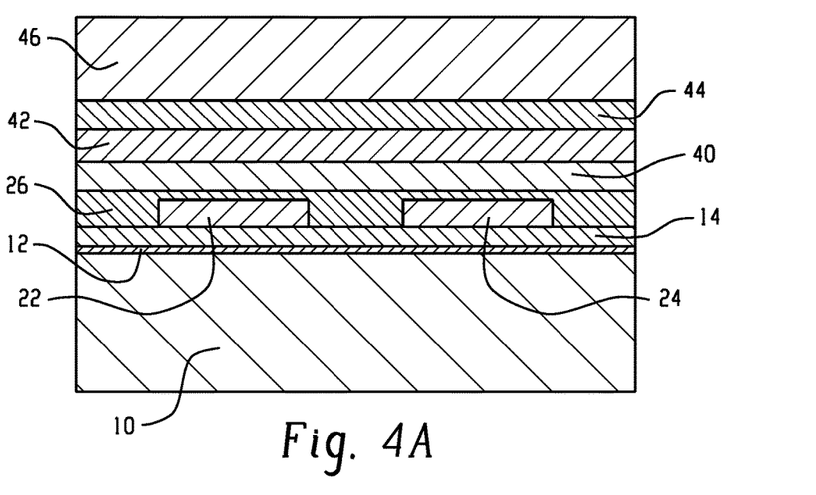
FIG. 4A is a cross-sectional view taken generally along line 4A-4A in FIG. 4.
Figure 4B:
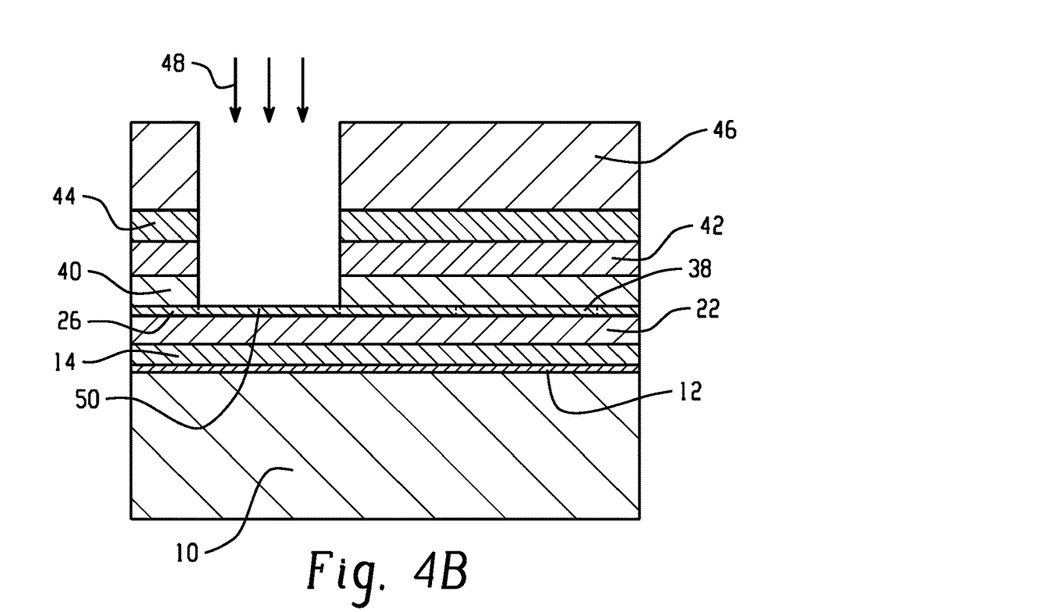
FIG. 4B is a cross-sectional view taken generally along line 4B-4B in FIG. 4.

With reference to FIGS. 4, 4A, 4B in which like reference numerals refer to like features in FIGS. 3, 3A, 3B and at a subsequent fabrication stage, the hardmask layers 28, 30, BARC layer 34, and block mask 32 are removed from layer 26, and hardmask layers 40, 42, a BARC layer 44, and a block mask 46 are formed on the top surface of the layer 26. Similar to hardmask layers 28, 30, the hardmask layer 40 may be comprised of a silicon-based spin-on silicon hardmask material (Si—SOH), and the hardmask layer 42 on top of the hardmask layer 40 may be comprised of as silicon oxynitride (SiON) deposited by CVD. The block mask 46, which is applied on the top surface of the BARC layer 44, may be comprised of a photoresist material that is applied by a spin coating process, pre-baked, exposed to a radiation projected through a photomask, baked after exposure, and developed with a chemical developer to form an opening at an intended location for a Seebeck terminal 50 to be formed by ion implantation in the layer 26.

With the block mask 46 present, energetic ions, as indicated diagrammatically by the single-headed arrows 48, are introduced into the layer 26 across the area of the opening in the block mask 46 to form the Seebeck terminal 50. The opening in the block mask 46 and the Seebeck terminal 50 extend transverse to the resistor bodies 22, 24, and cross over each of the resistor bodies 22, 24. The conductivity type of the semiconductor material of Seebeck terminal 50 is opposite to the conductivity type of the semiconductor material of Seebeck terminal 38. In an embodiment in which the conductivity type of the semiconductor material of Seebeck terminal 38 is selected to be p-type, the ions 48 may deliver an n-type dopant selected from Group V of the Periodic Table (e.g., arsenic (As) or phosphorus (P)) in a concentration effective to impart n-type conductivity to the semiconductor material of the layer 26. The ions 48 may be generated from a suitable source gas and implanted with selected implantation conditions (e.g., ion species, dose, kinetic energy) using an ion implantation tool. Areas of the layer 26 covered by the block mask 46, including the area implanted to form the Seebeck terminal 38, are not implanted.

Figure 5:
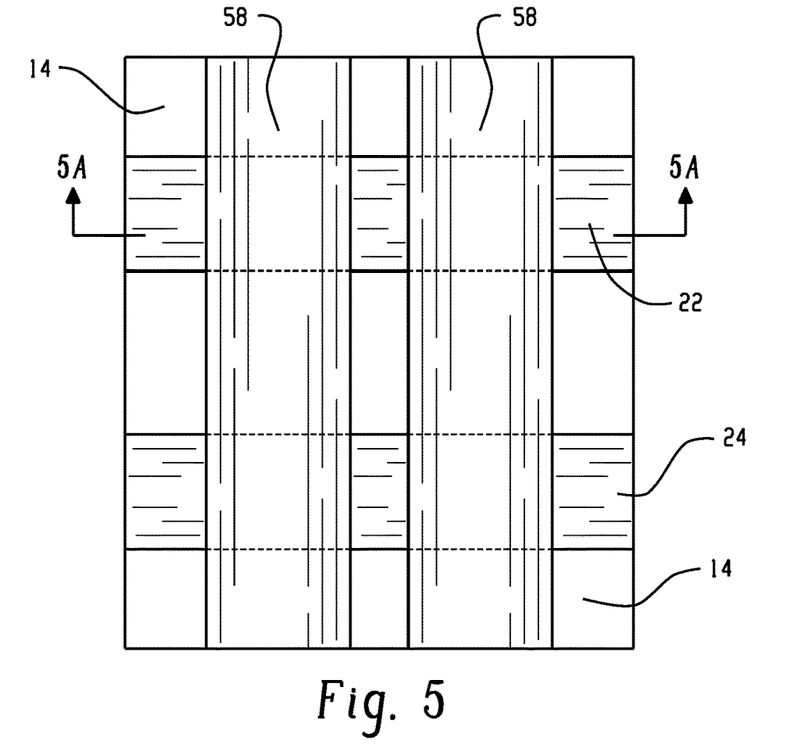
FIG. 5 is a top view of the device structure at a fabrication stage subsequent to FIG. 4.

With reference to FIG. 5 in which like reference numerals refer to like features in FIG. 4 and at a subsequent fabrication stage, the hardmask layers 40, 42, BARC layer 44, and block mask 46 are removed from layer 26, and hardmask layers 52, 54, a BARC layer 56, and an etch mask 58 are formed on the top surface of the layer 26. Similar to hardmask layers 28, 30, the hardmask layer 40 may be comprised of a silicon-based spin-on silicon hardmask material (Si—SOH), and the hardmask layer 42 on top of the hardmask layer 40 may be comprised of as silicon oxynitride (SiON) deposited by CVD. The etch mask 58 may be comprised of a photoresist material that is applied by a spin coating process, pre-baked, exposed to a radiation projected through a photomask, baked after exposure, and developed with a chemical developer to form features that cover all or a portion of each of the Seebeck terminals 38, 50.

With the etch mask 58 present, the layer 26 is patterned using an etching process, such as reactive ion etching (RIE), that removes the material of layer 26 from areas not masked by the etch mask 58. In particular, the final shape of the Seebeck terminals 38, 50 may be defined by the features of the etch mask 58 applied to pattern the layer 26. The Seebeck terminal 38 has a spaced relationship along the lengths of the resistor bodies 22, 24 with the Seebeck terminal 50 to form a gap, G, between the Seebeck terminals 38, 50. As a result, the Seebeck terminals 38, 50 are not in contact (i.e., have a non-contacting relationship). The etching process may stop on the material of the pad layer 14, and may remove the material of layer 26 selective to the material of the resistor bodies 22, 24. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

In an alternative embodiment, the layer 26 may be deposited and patterned to form the Seebeck terminals 38, 50 before the resistor material layer 16 is deposited and patterned to form the resistor bodies 22, 24.

Figure 5A:
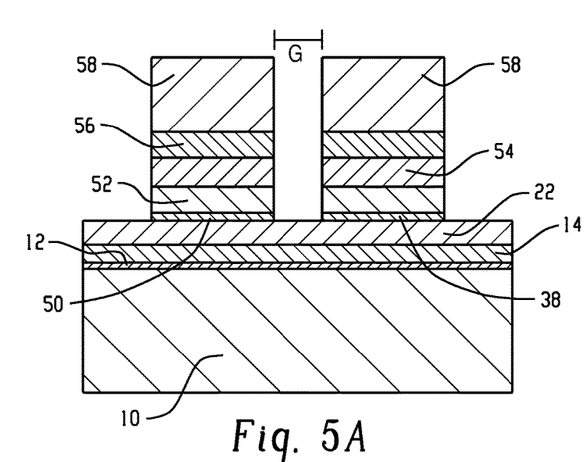
FIG. 5A is a cross-sectional view taken generally along line 5A-5A in FIG. 5.
Figure 6:
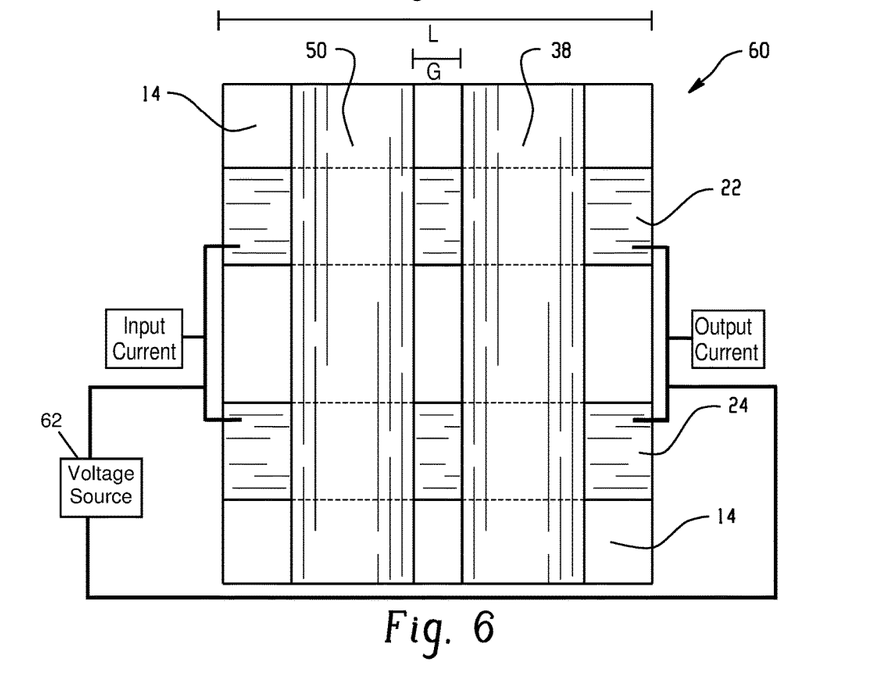
FIG. 6 is a top view of the device structure at a fabrication stage subsequent to FIG. 5.

With reference to FIG. 6 in which like reference numerals refer to like features in FIG. 5 and at a subsequent fabrication stage, the hardmask layers 52, 54, BARC layer 56, and etch mask 58 are removed following the masked etch of the layer 26. The resulting on-chip resistor 60 includes the resistor bodies 22, 24 and the Seebeck terminals 38, 50 that are carried on the substrate 10 and that are electrically isolated from the substrate 10 by the pad layers 12, 14. The patterning of the layer 26 separates the Seebeck terminal 38 from the Seebeck terminal 50 by the gap, G, (FIG. 5A) along the length, L, of the resistor bodies 22, 24 such that the Seebeck terminals 38, 50 are not touching.

During operation, the resistance of the on-chip resistor 60 adjusts through the operation of the Seebeck effect, which describes the occurrence of an electrical voltage induced by a temperature gradient. The Seebeck terminals 38, 50 are characterized by a Seebeck coefficient, which is a measure of the magnitude of a thermoelectric voltage induced in a material in response to a temperature difference across the material. The Seebeck coefficient can be selected through the doping levels of the polycrystalline semiconductor material constituting the Seebeck terminals 38, 50. The conductivity type of the Seebeck terminals 38, 50 may be swapped in order to provide either a positive or negative Seebeck coefficient.

Middle-of-line (MOL) processing and back-end-of-line (BEOL) processing follow, which includes formation of contacts and wiring for a MOL local interconnect structure, and formation of dielectric layers, via plugs, and wiring for a BEOL interconnect structure coupled by the local interconnect structure with the Seebeck terminals 38, 50 and with the resistor bodies 22, 24. Through metal features in the interconnect structures, a voltage of one polarity (e.g., positive) is applied at one end of the on-chip resistor 60 adjacent to the Seebeck terminal 38 and a voltage of the opposite polarity (e.g., negative) is applied at the opposite end of the on-chip resistor 60 adjacent to the Seebeck terminal 50. Through metal features in the interconnect structures, the resistor bodies 22, 24 are coupled in parallel, and a circuit current is supplied as an input current to the on-chip resistor 60 and exits as an output current from the on-chip resistor 60.

In use, the positive and negative voltages are applied from a voltage source 62 to electrically bias the Seebeck terminals 38, 50 of the on-chip resistor 60. In addition, an input current is supplied to one end of the on-chip resistor 60, is conducted through each of the resistor bodies 22, 24, and exits the on-chip resistor 60 as an output current. Each of the resistor bodies 22, 24, which have a parallel circuit arrangement, may carry a different fraction of the input current dependent on their individual electrical resistances.

The currents conducted through the resistor bodies 22, 24 cause Joule heating, which elevates the temperatures of the resistor bodies 22, 24. The temperature of the resistor body 22 may differ from the temperature of the resistor body 24. The Seebeck terminals 38, 50 form a Seebeck feedback loop that generates respective Seebeck voltages in the resistor bodies 22, 24. Specifically, a Seebeck voltage appears across the resistor body 22, and a different Seebeck voltage across the resistor body 24 that is opposite to the Seebeck voltage across the resistor appears body 22. Depending on the doping levels of the Seebeck terminals 38, 50, the Seebeck voltages may be equal and opposite. The Seebeck voltages induce Seebeck currents that rebalance the input current in each of the resistor bodies 22, 24 so as to compensate for temperature effects that impact the resistance of the resistor bodies 22, 24 through the TCR.

The TCR of the on-chip resistor 60 is tunable through the selection of, among other parameters, the lateral dimensions (e.g., length and width) of resistor body 22 in order to select its resistance value and the its lateral dimensions (e.g., length and width) of resistor body 24 through) in order to select its resistance value. The doping levels of the Seebeck terminals 38, 50 and their relative conductivity type may be used to determine the magnitude of the Seebeck coefficient, and whether the Seebeck coefficient is positive or negative.

The total resistance $R_T$ of the on-chip resistor 60, before a temperature change, is given by the following equation governing a pair of resistors, i.e., resistor bodies 22, 24, having individual resistances $R_1$ and $R_2$ and that are coupled in a parallel electrical circuit.

$$R_T = \frac{R_1 R_2}{R_1 + R_2}$$

As the result of a change in temperature of the on-chip resistor, the resistor bodies 22, 24 will experience respective temperature changes $\Delta T_1$ and $\Delta T_2$. The resistances of the resistor bodies 22, 24 will respectively change to $R_1'$ and $R_2'$ according to the following equations:

$$R_1' = R_1(1 + \alpha_1 \Delta T_1)$$

$$R_2' = R_2(1 + \alpha_2 \Delta T_2)$$

where $\alpha_1$ is the TCR for the material constituting the resistor body 22 and $\alpha_2$ is the TCR for the material constituting the resistor body 24.

The Seebeck coefficient $\beta$ for the Seebeck terminals 38, 50 can be either positive or negative depending on the polarity order of the Seebeck terminals 38, 50 that is governed by their conductivity types. The generated Seebeck potential is given by the following equation:

$$\Delta V = \beta(\Delta T_1 - \Delta T_2)$$

The resistance $R_T'$ of the on-chip resistor 60, after the temperature change, is given by:

$$R'_T = \cfrac{V}{\cfrac{V+\Delta V}{R'_1} + \cfrac{V-\Delta V}{R'_2}} = \cfrac{V}{\cfrac{V+\beta(\Delta T_1-\Delta T_2)}{R_1(1+\alpha_1\Delta T_1)} + \cfrac{V+\beta(\Delta T_1-\Delta T_2)}{R_2(1+\alpha_2\Delta T_2)}} = \cfrac{V}{\cfrac{V}{R_1} \cdot \cfrac{1+\frac{\beta}{V}(\Delta T_1-\Delta T_2)}{1+\alpha_1\Delta T_1} + \cfrac{V}{R_2} \cdot \cfrac{1+\frac{\beta}{V}(\Delta T_1-\Delta T_2)}{1+\alpha_2\Delta T_2}}$$

In embodiments, these parameters may be selected such that the TCR of the on-chip resistor 60 is equal to zero (0). If so, the result of the operation of the Seebeck effect is that the current flowing through, for example, the resistor body 22 may be increased by an amount equal to a reduction in the current flowing through the resistor body 24, and the output current from the on-chip resistor 60 remains constant with temperature changes. From the previous equation, the on-chip resistor 60 will have a zero TCR if the following equation is satisfied:

$$\frac{V}{R_1} \cdot \frac{1+\frac{\beta}{V}(\Delta T_1-\Delta T_2)}{1+\alpha_1\Delta T_1} + \frac{V}{R_2} \cdot \frac{1+\frac{\beta}{V}(\Delta T_1-\Delta T_2)}{1+\alpha_2\Delta T_2} = \frac{V}{R_1} + \frac{V}{R_2}$$

For a set of given values for TCR of the resistor bodies 22, 24, the previous equation can be satisfied by selection of the value of the Seebeck coefficient through doping and the polarity order of Seebeck terminals 38, 50.

In embodiments, these parameters may be selected such that the TCR of the on-chip resistor 60 is negative (i.e., less than zero (0)). The on-chip resistor 60 will have a negative TCR if the following inequality is satisfied:

$$\frac{V}{R_1} \cdot \frac{1+\frac{\beta}{V}(\Delta T_1-\Delta T_2)}{1+\alpha_1\Delta T_1} + \frac{V}{R_2} \cdot \frac{1+\frac{\beta}{V}(\Delta T_1-\Delta T_2)}{1+\alpha_2\Delta T_2} > \frac{V}{R_1} + \frac{V}{R_2}$$

In embodiments, these parameters may be selected such that the TCR of the on-chip resistor 60 is positive (i.e., greater than zero (0)). The on-chip resistor 60 will have a positive TCR if the following inequality is satisfied:

$$\frac{V}{R_1} \cdot \frac{1+\frac{\beta}{V}(\Delta T_1-\Delta T_2)}{1+\alpha_1\Delta T_1} + \frac{V}{R_2} \cdot \frac{1+\frac{\beta}{V}(\Delta T_1-\Delta T_2)}{1+\alpha_2\Delta T_2} < \frac{V}{R_1} + \frac{V}{R_2}$$

The Seebeck coefficient for the for the Seebeck terminals 38, 50 is given by:

$$\beta = \frac{R_1(1+\alpha_1\Delta T_1)\alpha_2\Delta T_2 + R_2\alpha_1\Delta T_1(1+\alpha_2\Delta T_2)}{(\Delta T_1-\Delta T_2)[R_2(1+\alpha_2\Delta T_2) - R_1(1+\alpha_1\Delta T_1)]} \cdot V$$

The value of the Seebeck coefficient can be selected to provide either a positive TCR or a negative TCR for the on-chip resistor.

The TCR of the on-chip resistor 60 may be selected based on, among other factors, a selection of the drawn dimensions (i.e., length and width) of the resistor bodies 22, 24 when the resistor material layer 16 is patterned. This contrasts with conventional methods of selecting the TCR for an on-chip resistor that may involve adjustments in material properties such as resistor thickness, the doping level in the resistor material, the grain size of polycrystalline resistor material, and composition of the resistor material. The Seebeck feedback loop permits the TCR of the entire on-chip resistor 60 to be controlled independent of many, if not all, of the individual characteristics and properties of the resistor bodies 22, 24.

In use, the self-generated thermal energy generates an electrical feedback voltage which tunes a specific temperature behavior characteristic, such as the TCR, of the on-chip resistor 60. The TCR of the on-chip resistor 60 may be tuned, which fabricated, to be zero, positive or negative. The Seebeck currents rebalance the currents flowing through the resistor bodies 22, 24 in order to achieve a targeted TCR. If the TCR is tuned to be equal to zero, the resistance of the on-chip resistor 60 does not vary with temperature during the operation of the on-chip resistor 60, and the resistance of the on-chip resistor 60 may remain equal to the resistance of an external load resistor of fixed resistance that is coupled with the on-chip resistor 60 in order to provide maximum signal transfer.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An on-chip resistor comprising:
   a first resistor body;
   a second resistor body;
   a first Seebeck terminal arranged to overlap with the first resistor body and with the second resistor body; and
   a second Seebeck terminal arranged to overlap with the first resistor body and with the second resistor body, the second Seebeck terminal having a spaced relationship with the first Seebeck terminal along a length of the first resistor body and the second resistor body,
   wherein the on-chip resistor has a temperature coefficient of resistance, and the temperature coefficient of resistance of the on-chip resistor is based at least in part on a Seebeck coefficient of the first Seebeck terminal and the second Seebeck terminal.

2. The on-chip resistor of claim 1 wherein the first Seebeck terminal is comprised of a polycrystalline semiconductor material doped to have p-type conductivity, and the second Seebeck terminal is comprised of a polycrystalline semiconductor material doped to have n-type conductivity.

3. The on-chip resistor of claim 1 wherein the first resistor body and the second resistor body are comprised of tungsten silicide.

4. The on-chip resistor of claim 3 wherein the first Seebeck terminal is comprised of a polycrystalline semiconductor material doped to have p-type conductivity, and the second Seebeck terminal is comprised of a polycrystalline semiconductor material doped to have n-type conductivity.

5. The on-chip resistor of claim 1 wherein the Seebeck coefficient is selected such that the temperature coefficient of resistance of the on-chip resistor is equal to zero.

6. The on-chip resistor of claim 1 wherein the Seebeck coefficient is selected such that the temperature coefficient of resistance of the on-chip resistor is negative.

7. The on-chip resistor of claim 1 wherein the Seebeck coefficient is selected such that the temperature coefficient of resistance of the on-chip resistor is positive.

8. The on-chip resistor of claim 1 wherein the first resistor body is located on a dielectric layer, the first resistor body is vertically arranged between the first Seebeck terminal and the dielectric layer, and the first resistor body is vertically arranged between the second Seebeck terminal and the dielectric layer.

9. The on-chip resistor of claim 8 wherein the second resistor body is located on the dielectric layer, the second resistor body is vertically arranged between the first Seebeck terminal and the dielectric layer, and the second resistor body is vertically arranged between the second Seebeck terminal and the dielectric layer.

10. The on-chip resistor of claim 1 wherein the second resistor body is coupled in a parallel electrical circuit with the first resistor body.

11. The on-chip resistor of claim 1 wherein the temperature coefficient of resistance of the on-chip resistor is based at least in part on a plurality of lateral dimensions of the first resistor body during patterning and a plurality of lateral dimensions of the second resistor body during patterning.

12. A method comprising:
    forming a first resistor body of an on-chip resistor;
    forming a second resistor body of the on-chip resistor;
    forming a first Seebeck terminal arranged to overlap with the first resistor body and the second resistor body; and
    forming a second Seebeck terminal arranged to overlap with the first resistor body and the second resistor body,
    wherein the second Seebeck terminal is formed in a spaced relationship with the first Seebeck terminal along a length of the first resistor body and the second resistor body, and the on-chip resistor has a temperature coefficient of resistance, and the temperature coefficient of resistance of the on-chip resistor is based at least in part on a Seebeck coefficient of the first Seebeck terminal and the second Seebeck terminal.

13. The method of claim 12 wherein forming the first Seebeck terminal arranged to overlap with the first resistor body and the second resistor body comprises:
    depositing a layer comprised of a polycrystalline semiconductor material; and
    implanting a first portion of the layer with a p-type dopant to form the first Seebeck terminal.

14. The method of claim 13 wherein forming the second Seebeck terminal arranged to overlap with the first resistor body and the second resistor body comprises:
    implanting a second portion of the layer with an n-type dopant to form the second Seebeck terminal.

15. The method of claim 14 further comprising:
    removing a third portion of the layer between the first Seebeck terminal and the second Seebeck terminal such that the first Seebeck terminal and the second Seebeck terminal have a non-contacting relationship.

16. The method of claim 12 wherein the first resistor body and the second resistor body are formed simultaneously, and further comprising:
    depositing a layer comprised of a resistor material; and
    patterning the layer to simultaneously form the first resistor body and the second resistor body.

17. The method of claim 16 wherein the temperature coefficient of resistance of the on-chip resistor is based at least in part on a plurality of lateral dimensions of the first resistor body during patterning and a plurality of lateral dimensions of the second resistor body during patterning.

18. The method of claim 12 wherein the second resistor body is coupled in a parallel electrical circuit with the first resistor body.

19. The method of claim 12 wherein the first resistor body and the second resistor body are formed before the first Seebeck terminal and the second Seebeck terminal are formed.

20. The method of claim 12 wherein the first Seebeck terminal and the second Seebeck terminal are configured to generate a first voltage across the first resistor body and a second voltage across the second resistor body in response to a temperature change.

* * * * *